(12) United States Patent
Kwong

(10) Patent No.: US 7,116,165 B2
(45) Date of Patent: Oct. 3, 2006

(54) FRONT STAGE AMPLIFIER WITH DIFFERENT MODES

(75) Inventor: Kam Choon Kwong, Singapore (SG)

(73) Assignee: Koninklijke Philips Electronics N.V., Eindhoven (NL)

( * ) Notice: Subject to any disclaimer, the term of this patent is extended or adjusted under 35 U.S.C. 154(b) by 74 days.

(21) Appl. No.: 10/507,192

(22) PCT Filed: Feb. 17, 2003

(86) PCT No.: PCT/IB03/00617
§ 371 (c)(1),
(2), (4) Date: Sep. 9, 2004

(87) PCT Pub. No.: WO03/077415
PCT Pub. Date: Sep. 18, 2003

(65) Prior Publication Data
US 2005/0162224 A1    Jul. 28, 2005

(30) Foreign Application Priority Data
Mar. 13, 2002 (WO) .............. PCT/SG02/00042

(51) Int. Cl.
H03F 3/20 (2006.01)

(52) U.S. Cl. ..................................... 330/129
(58) Field of Classification Search .............. 330/51, 330/254, 282, 285, 86, 296, 110; 455/234.1, 455/250.1
See application file for complete search history.

(56) References Cited

U.S. PATENT DOCUMENTS

| 5,930,696 | A | 7/1999 | Tzuang et al. ............ 455/311 |
| 6,667,657 | B1* | 12/2003 | Nakatani et al. ........... 330/51 |
| 2005/0020227 | A1* | 1/2005 | Kumagawa et al. ..... 455/234.1 |

FOREIGN PATENT DOCUMENTS

| JP | 03-208417 | 9/1991 |
| JP | 10-084500 | 3/1998 |
| JP | 01-177429 | 6/2001 |

* cited by examiner

Primary Examiner—Robert Pascal
Assistant Examiner—Hieu Nguyen

(57) ABSTRACT

A multimode front stage amplifier and method of amplifying a signal having an optimum signal output for weak signals as well as for strong signals provided for TV tuners. A product having a multimode front stage amplifier and provisions for selecting different modes of processing the signal.

17 Claims, 2 Drawing Sheets

FRONT STAGE AMPLIFIER WITH DIFFERENT MODES

FIELD OF THE INVENTION

The invention relates to amplifiers in general, and more specifically to amplifiers typically used in radio frequency (RF) receivers.

BACKGROUND OF THE INVENTION

Amplifiers are used for amplifying input RF signals to receivers such as TV tuners, multimedia tuners, and tuners for PCs.

Presently in a TV tuner (TV set), for example, there exist different types of amplifiers, for example, a low-noise amplifier (LNA) type amplifier with a bypass, or a power splitter type amplifier.

These two concepts have been used until today by most of the TV set manufacturers, but both concepts have disadvantages. An LNA, for example, with a high gain and low noise, is not able to handle normal cable TV signals, and a power splitter amplifier that is able to handle such signals has relatively high noise. These two drawbacks cause problems, for example, when a TV set should be connectable to both a cable TV system and a conventional antenna and at the same time provide a high quality.

JP-A-10084500 describes a LNA for improved sensitivity especially for low-level signals with a sensor for a certain threshold. The LNA can not be used as a splitter for strong cable signals, for example, since the bypass suffers from implementation loss.

SUMMARY OF THE INVENTION

It is an object of the invention to provide an amplifier that has an optimum signal output for weak signals as well as for strong signals.

Herein, a "strong signal" denotes a signal having a strength comparable to a cable TV signal, a "weak signal" denotes a signal having a strength comparable to a signal from a conventional outdoor antenna.

The term "strong signal" typically refers to signals >1 mV, the term "medium signal" typically refers to signals >316 µV but <1 mV, and the term "weak signal" typically refers to signals <316 µV. These values are not absolute, but an example. Signal values that are outside these limits but have a similar size are also within the scope of the invention as defined in the claims.

According to a first aspect of the invention, the object is obtained by a multi-mode amplifier that can be switched between high gain in case of a weak signal and low gain in case of a strong signal.

In this way, the amplifier can have different characteristics for different signals; this is of great importance in particular for hybrid analog/digital tuners.

According to a preferred embodiment of the invention, there is provided an amplifier device, the amplifier device comprising: amplifier means for amplifying a radio frequency (RF) input signal, and a controllable feedback loop for adjusting a gain and a bias voltage applied to the amplifier means for adjusting a current determining a noise level, arranged to provide at least two different modes, a first mode providing high gain and low noise for handling weak signals and a second mode providing low-gain power splitting for handling strong signals. The mode can be selected independence on the input signal received, which will result in an optimum signal output.

Preferably, the amplifier device comprises a mode selection means, and the feedback loop connected between an output and an input of the amplifier means comprises at least two resistors a first resistor and a second resistor connected in parallel to each other, wherein the second resistor is connected in series with a switch controlled by the mode selection means, which mode selection means also controls a bias voltage applied to the amplifier means. This is a cost-effective solution when two modes are required to deliver optimum signal outputs depending on whether a strong or a weak input signal is received. The mode selection means comprises circuitry for selecting between the at least two different modes.

Preferably, the mode selection means control the feedback loop and the bias voltage to provide a third mode providing high gain and high current. This third mode delivers an optimum signal output when receiving a medium-level input signal.

According to another embodiment of the invention, a product is provided comprising the amplifier device and provisions for selecting the modes. In this case the optimum signal outputs of the amplifier device in the product may be selected manually or automatically.

According to another preferred embodiment of the invention, a method of amplifying a radio frequency (RF) signal is provided comprising the steps of:

amplifying the signal in at least a first mode and a second mode by amplifier means having at least two modes, said first mode providing high gain and low noise for weak signals, and said second mode providing low gain for handling strong signals. Preferably, the method further comprises the step of:

amplifying the signal in a third mode, said third mode providing high gain and high current for medium signals.

These and other aspects and embodiments of the invention will be apparent from the preferred embodiments(s) described hereinafter.

BRIEF DESCRIPTION OF THE DRAWINGS

The present invention will be more clearly understood from the following description of the preferred embodiments of the invention read in conjunction with the attached drawings, in which.

DETAILED DESCRIPTION OF THE INVENTION

Figure 1:
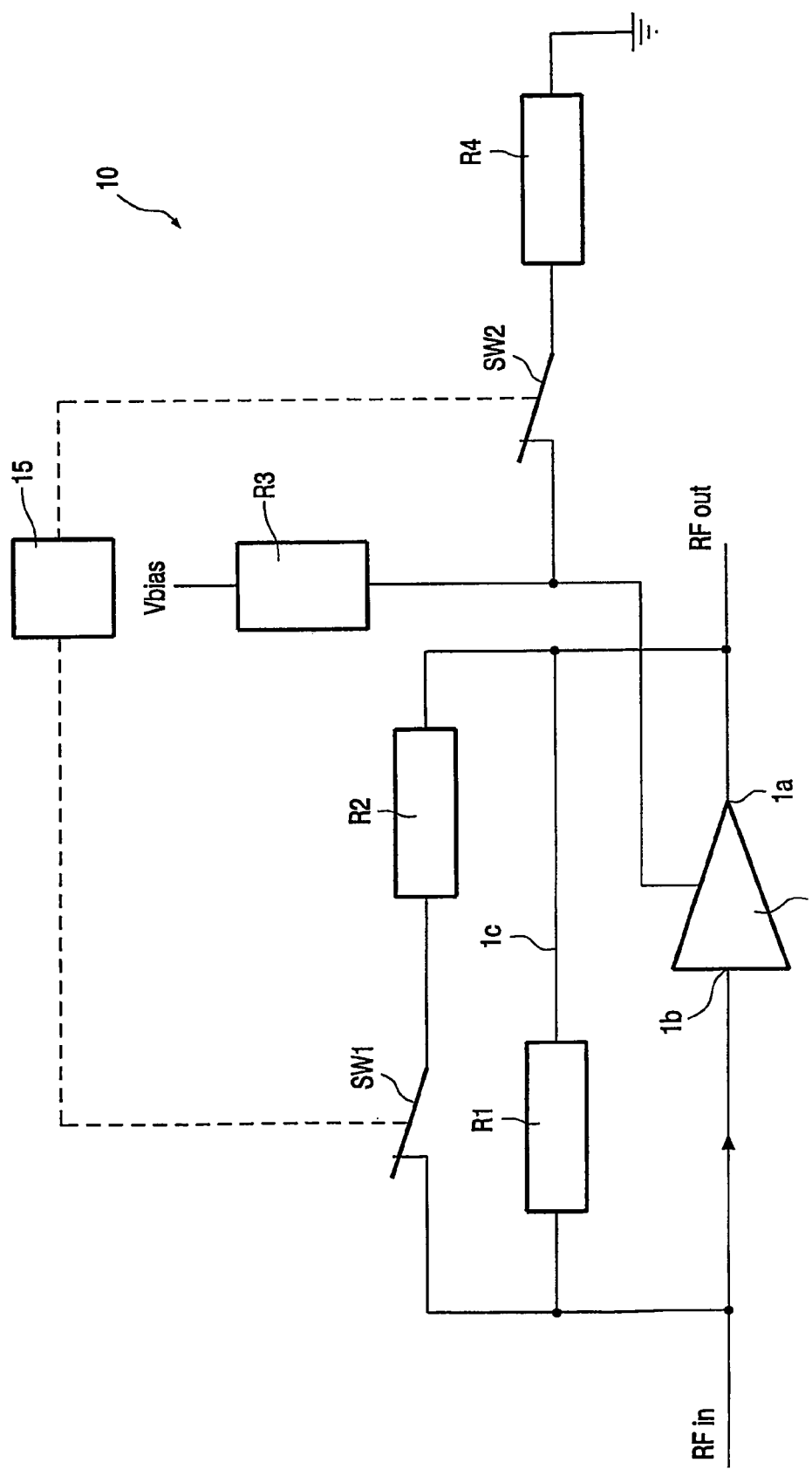
FIG. 1 is a circuit diagram showing an amplifier device according to a preferred embodiment of the invention.

FIG. 1 shows a circuit diagram of an amplifier device 10 according to a preferred embodiment of the invention. The amplifier device 10 comprises an operational amplifier 1 having an output 1a for delivering a radio-frequency output signal RFout connected in a feedback loop 1c to an input 1b of the amplifier 1 for receiving a radio-frequency input signal RFin. The feedback loop 1c comprises two different resistors, a first resistor R1 and a second resistor R2 connected in parallel to each other, which resistors R1 and R2 can be connected in different ways by means of a first switch SW1 connected in series with one of the resistors R1 and R2, in this case the second resistor R2. The first switch SW1 is shown in an OFF position, corresponding to an LNA mode. The amplifier device 10 further comprises two resistors controlling the bias of the operational amplifier 1, i.e. a third resistor R3 coupled to a voltage Vbias and a fourth resistor R4 connected to ground, both coupled to the amplifier 1 (at the same terminal). The fourth resistor R4 is controlled by means of a second switch SW 2 connected in series with the fourth resistor R4.

The amplifier device (10) can be used as a device coupled to a tuner input or as an improved splitter arranged to supply output signals to at least two tuners.

Figure 2:
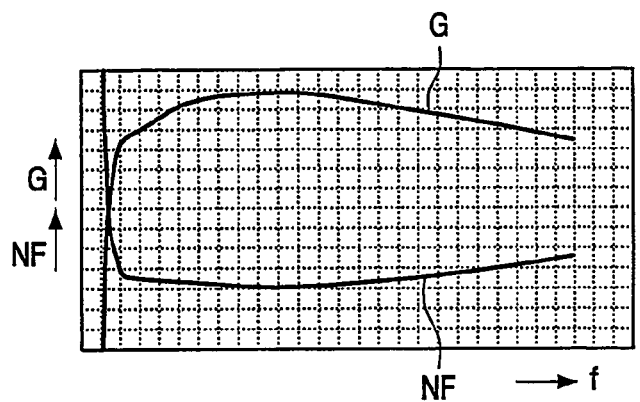
FIG. 2 is a graph showing how the amplifier device in FIG. 1 operates in a splitter mode.
Figure 3:
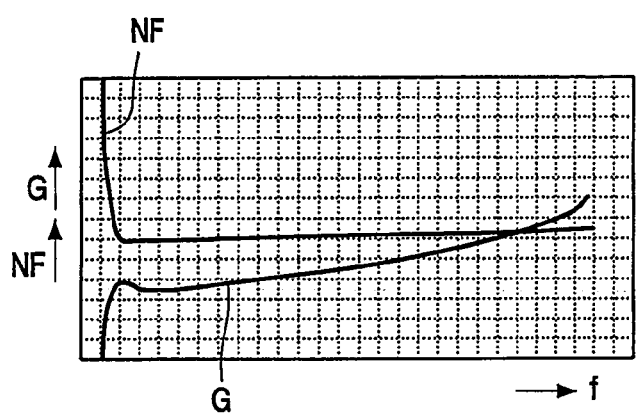
FIG. 3 is a graph showing how the amplifier device in FIG. 1 operates in an LNA mode.

When the amplifier device 10 operates in the LNA mode, the second switch SW2 is ON. The operational curve is shown in FIG. 2 showing gain G and noise figure NF plotted versus frequency f. When operating in the power splitter mode, the first switch SW1 is ON and the second switch SW2 is OFF. The curve of this mode is illustrated in FIG. 3, where gain G and noise figure NF are plotted versus frequency f.

The first and second switches SW1 and SW2 are controlled by a mode selection means 15.

A third mode is achieved when both switches SW1 and SW2 are OFF, whereby a high gain splitter and high current LNA is obtained at the same time. This third mode is intended for a medium-strength signal.

The mode selection means 15 can be controlled by a button on a remote control device or via another switch on the amplifier device (15) or on a product in which the amplifier device (15) is present. The mode selection means 15 may also be arranged to be controlled automatically by using an output of a signal to noise ratio detector as can be found in IF-processors.

As described, an LNA tuner of today is not always able to handle signals offered by a cable TV system and therefore requires a bypass. Due to implementation losses, it suffers an overall deterioration in system performance anywhere from −1 dB (at 50 MHz) to −3 dB (at 860 MHz). By switching this LNA to the splitter mode, which is accomplished by mode selection means 15 controlling the switches SW1 and SW2 (indicated by dashed lines in FIG. 1), the amplifier device 10 is also able to handle these cable TV signals without any loss in system performance compared to a "normal" tuner.

In the LNA mode, a receiver (not shown) coupled to the output of the amplifier device 10 is able to achieve good noise properties (typically low noise) and high gain.

In the splitter mode, a receiver (not shown) does not suffer from any degradation due to the lower gain of the amplifier device (10) since it is operating in the splitter mode. The wide input stage will give the amplifier device (10) the same intermodulation limitation as a splitter.

In the third mode, the gain of the amplifier device is increased while keeping the current high for an intermodulation level between the level of a splitter and the LNA mode. The overall system signal to noise (S/N) performance is improved thereby.

A typical performance for an amplifier device according to the invention is:

| LNA mode: | RF-IF NF 3 dB, gain >50 dB |
| Splitter mode with RF out: | RF-IF NF 8 dB, gain >40 dB |

Figure 4:
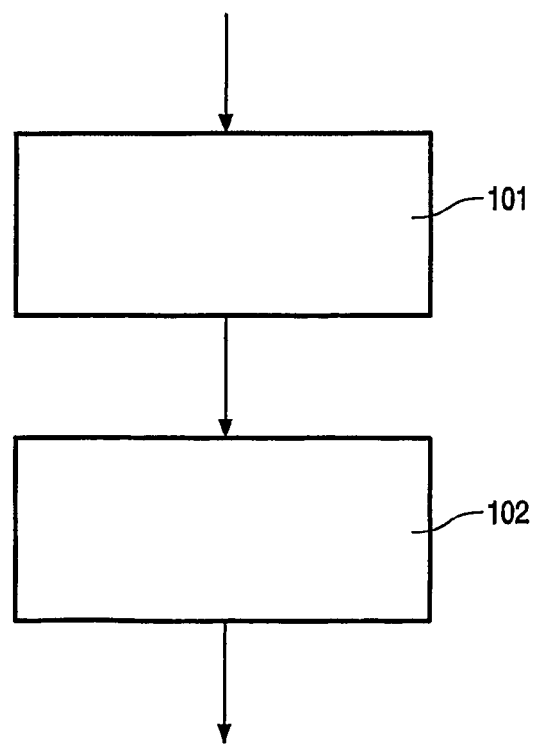
FIG. 4 is a flow chart illustrating a method according a preferred embodiment of the invention.

The invention may also be realized in a method, which will be described below with reference to FIG. 4.

A first step 101 comprises amplifying the signal in at least a first mode and a second mode by amplifier means having at least two modes, said first mode providing high gain and low noise for weak signals, and said second mode providing low gain power splitting for handling strong signals.

A second step 102 comprises amplifying the signal in a third mode, said third mode providing high gain and high current for medium signals.

The invention finds its application, for example, in handling cable, terrestrial, and satellite TV signals.

As used in the following claims, it should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The verb "comprise" in all its conjugations does not exclude the presence of elements or steps other than those listed in a claim. The word "a" or "an" preceding an element does not exclude the presence of a plurality of such elements. The invention can be implemented by means of hardware comprising several distinct elements, and by means of a suitably programmed computer. In the device claim enumerating several means, several of these means can be embodied by one and the same item of hardware. The mere fact that certain measures are recited in mutually different dependent claims does not indicate that a combination of these measures cannot be used to advantage. (See above).

The invention claimed is:

1. An amplifier device, said amplifier device comprising:
   amplifier means for amplifying a radio-frequency input signal RFin,
   a controllable feedback loop for adjusting a gain and a bias voltage applied to the amplifier means for adjusting a current determining a noise level, the feedback loop and the bias voltage being arranged to provide at least two different modes, a first mode providing high gain and low noise for handling weak signals and a second mode providing low-gain power splitting for handling strong signals.

2. An amplifier device as claimed in claim 1, wherein the amplifier device comprises mode selection means, and the feedback loop is connected between an output and an input of the amplifier means, the feedback loop comprising at least a first resistor and a second resistor connected in parallel to each other, and wherein the second resistor is connected in series with a switch controlled by the mode selection means, which also control the bias voltage applied to the amplifier means.

3. An amplifier device as claimed in claim 1, further comprising mode selection means arranged to control the feedback loop and the bias voltage to provide a third mode providing high gain and high current.

4. A product comprising the amplifier device as claimed in claim 1 and means for selecting the at least two different modes.

5. A method of amplifying a radio-frequency signal, the method comprising the step of:

amplifying the signal in at least a first mode and a second mode by amplifier means having at least two modes, said first mode providing high gain and low noise for weak signals, and said second mode providing low-gain power splitting for handling strong signals,
wherein the amplifier means is turned on in both the first mode and second mode to provide a higher gain and lower noise figure in the first mode, and a lower gain and higher noise figure in the second mode.

6. A method as claimed in claim 5, further comprising the step of:
amplifying the signal in a third mode, said third mode providing high gain and high current for medium signals.

7. The amplifier device of claim 1, wherein the amplifier means is an operational amplifier.

8. The amplifier device of claim 1, wherein the high gain and the low-gain are both greater than unity.

9. The amplifier device of claim 1, wherein high gain and the low-gain are both greater than 10 dB.

10. The method of claim 6, wherein the high gain and the low-gain are both greater than unity.

11. The method of claim 6, wherein the high gain and the low-gain are both greater than 10 dB.

12. An amplifier device, comprising:
an amplifier having a first input adapted to receive a radio frequency signal, a second input, and an output adapted to output an amplified RE signal;
a feedback path extending between the output of the amplifier and the input of the amplifier, the feedback path having an impedance that is at least selectable between a first impedance value and a second impedance value;
a bias voltage circuit connected to the second input of the amplifier, the bias voltage circuit being adapted to supply a bias voltage to the second input of the amplifier that is at least selectable between a first bias voltage value and a second bias voltage value; and
a mode selection means adapted to select the impedance of the feedback path and to select the bias voltage to provide at least two different modes, a first mode providing high gain and low noise for handling weak signals, and a second mode providing low-gain power splitting for handling strong signals.

13. The amplifier device of claim 12, wherein the mode selection means is further adapted to provide a third mode providing high gain and high current.

14. The amplifier device of claim 12, wherein the amplifier is an operational amplifier.

15. The amplifier device of claim 12, wherein the feedback path includes at least a first resistor and a second resistor connected in parallel to each other, and wherein the second resistor is connected in series with a switch controlled by the mode selection means.

16. The amplifier device of claim 15, wherein the bias voltage circuit includes:
a third resistor connected between a bias supply voltage and the second input of the amplifier;
a fourth resistor connected to ground; and
a second switch connected between the second input of the amplifier and the second resistor.

17. The amplifier device of claim 12, wherein the bias voltage circuit includes:
a first resistor connected between a bias supply voltage and the second input of the amplifier;
a second resistor connected to ground; and
a switch connected between the second input of the amplifier and the second resistor.

* * * * *